(12) United States Patent
Jeter et al.

(10) Patent No.: US 12,014,060 B2
(45) Date of Patent: Jun. 18, 2024

(54) MEMORY CALIBRATION AND MARGIN CHECK

(71) Applicant: Apple Inc., Cupertino, CA (US)

(72) Inventors: Robert E. Jeter, Santa Clara, CA (US); Jingkui Zheng, Santa Clara, CA (US); Ritesh J. Shah, Sunnyvale, CA (US); Veera Chockalingam, Santa Clara, CA (US); Naveen Kumar Korada, Round Rock, TX (US)

(73) Assignee: Apple Inc., Cupertino, CA (US)

( * ) Notice: Subject to any disclaimer, the term of this patent is extended or adjusted under 35 U.S.C. 154(b) by 105 days.

(21) Appl. No.: 17/929,212

(22) Filed: Sep. 1, 2022

(65) Prior Publication Data

US 2024/0078029 A1    Mar. 7, 2024

(51) Int. Cl.
| | | |
|---|---|---|
| *G11C 29/00* | (2006.01) | |
| *G06F 3/06* | (2006.01) | |
| *G11C 11/4076* | (2006.01) | |
| *G11C 11/4096* | (2006.01) | |
| *G11C 29/50* | (2006.01) | |

(52) U.S. Cl.
CPC .......... *G06F 3/0632* (2013.01); *G06F 3/0614* (2013.01); *G06F 3/0658* (2013.01); *G06F 3/0673* (2013.01); *G11C 11/4076* (2013.01); *G11C 11/4096* (2013.01); *G11C 29/50* (2013.01)

(58) Field of Classification Search
CPC .... G06F 3/0632; G06F 3/0614; G06F 3/0658; G06F 3/0673; G11C 11/4076; G11C 11/4096; G11C 29/50
See application file for complete search history.

(56) References Cited

U.S. PATENT DOCUMENTS

| 8,059,476 B2 | 11/2011 | Ware et al. |
| 9,666,264 B1 | 5/2017 | Jeter et al. |
| 2017/0154660 A1 | 6/2017 | Bialas, Jr. et al. |
| 2018/0081582 A1* | 3/2018 | Chun .................. G06F 11/3495 |
| 2019/0187189 A1 | 6/2019 | Jeter et al. |

(Continued)

OTHER PUBLICATIONS

International Search Report and Written Opinion in PCT Appl. No. PCT/US2023/026855 dated Oct. 16, 2023, 8 pages.

*Primary Examiner* — Christine T. Tu
(74) *Attorney, Agent, or Firm* — Kowert, Hood, Munyon, Rankin & Goetzel, P.C.; Dean M. Munyon

(57) ABSTRACT

Memory calibration with a margin check is disclosed. A memory subsystem includes a memory and a memory controller coupled to the memory. The memory controller includes a calibration circuit configured to perform, during an initialization process, horizontal memory calibrations for ones of a plurality of performance states and to determine and store, in a storage circuit, information indicative of a set of differences between calibration results for pairs of the plurality of performance states. The memory controller is further configured to, subsequent to the initialization process and in response to a change from a first one of the plurality of performance states to a second one of the plurality of performance states set initial memory parameters for the second performance state based on the set of differences. Thereafter, operation begins in the second performance state without performing an initial horizontal calibration.

20 Claims, 8 Drawing Sheets

(56) References Cited

U.S. PATENT DOCUMENTS

| | | | |
|---|---|---|---|
| 2022/0044739 A1* | 2/2022 | Fitzpatrick | G11C 29/021 |
| 2022/0066677 A1 | 3/2022 | Rayaprolu et al. | |
| 2022/0189519 A1 | 6/2022 | Jeter et al. | |
| 2022/0238149 A1 | 7/2022 | Hsieh et al. | |
| 2022/0270664 A1 | 8/2022 | Jeter et al. | |
| 2023/0115215 A1* | 4/2023 | Jeter | G06F 3/0632 |
| | | | 714/48 |

* cited by examiner the memory and the memory controller. A first point of the margin check calibration is at a delay less than that of the most recent calibrated value, while the second point is at a delay that is greater than the most recent calibrated value. If passing results are obtained at both points, a full horizontal calibration is skipped, and operation continues using the most recently calibrated parameter values (e.g. those that were applied based on the set of differences).

MEMORY CALIBRATION AND MARGIN CHECK

BACKGROUND

Technical Field

This disclosure is directed to memory subsystems, and more particularly, calibrations performed in memory subsystems.

Description of the Related Art

Eye patterns, or eye diagrams, are graphic illustrations that illustrate times and amplitudes at which a digital signal can be sampled at its correct value. In various types of systems that include data transmissions, it is desirable to sample signals (e.g., data signals synchronized by a clock signal) near a center of an eye, in terms of time and sampling voltage. In terms of timing, this can provide a signal with a sufficient amount of both setup and hold time, while also rendering it less susceptible to noise. In terms of voltage, this can enable a more accurate determination of a logic value (e.g., logic 1 or logic 0) based on a reference voltage used to distinguish one from the other.

In memory subsystems, calibrations may be performed to determine the points at which signals are sampled within the eye pattern. Calibrations are performed to determine an eye diagram that enables accurate sampling of signals, and thus include calibrations based both on the timing (sometimes referred to as a horizontal calibration) and sampling reference voltage (sometimes referred to as a vertical calibration). Performing these calibrations typically includes adjusting a number of different parameters that govern transmission of data between a memory controller and a memory. These parameters include a delay applied to a data strobe signal during the horizontal calibrations. A vertical calibration may include a number of horizontal calibrations performed at different reference voltages. Such calibrations may be performed during a system startup, and may also be performed on a periodic basis thereafter. Calibrations may also be performed in response to changes of a performance state.

SUMMARY

Memory calibration with a margin check is disclosed. In one embodiment, a memory subsystem includes a memory and a memory controller coupled to the memory. The memory controller includes a calibration circuit configured to perform, during an initialization process, horizontal memory calibrations for ones of a plurality of performance states and to determine and store, in a storage circuit, information indicative of a set of differences between calibration results for pairs of the plurality of performance states. The memory controller is further configured to, subsequent to the initialization process and in response to a change from a first one of the plurality of performance states to a second one of the plurality of performance states set initial memory parameters for the second performance state based on the set of differences. Thereafter, operation begins in the second performance state without performing an initial horizontal calibration.

In one embodiment, after beginning operation in the second performance state, the calibration circuit may perform a margin check calibration. In performing the margin check calibration, the calibration circuit runs a calibration routine at two points. The points correspond to delay values applied to a data strobe signal that is used to synchronize data transfers between

BRIEF DESCRIPTION OF THE DRAWINGS

The following detailed description makes reference to the accompanying drawings, which are now briefly described.

DETAILED DESCRIPTION OF EMBODIMENTS

Figure 1:
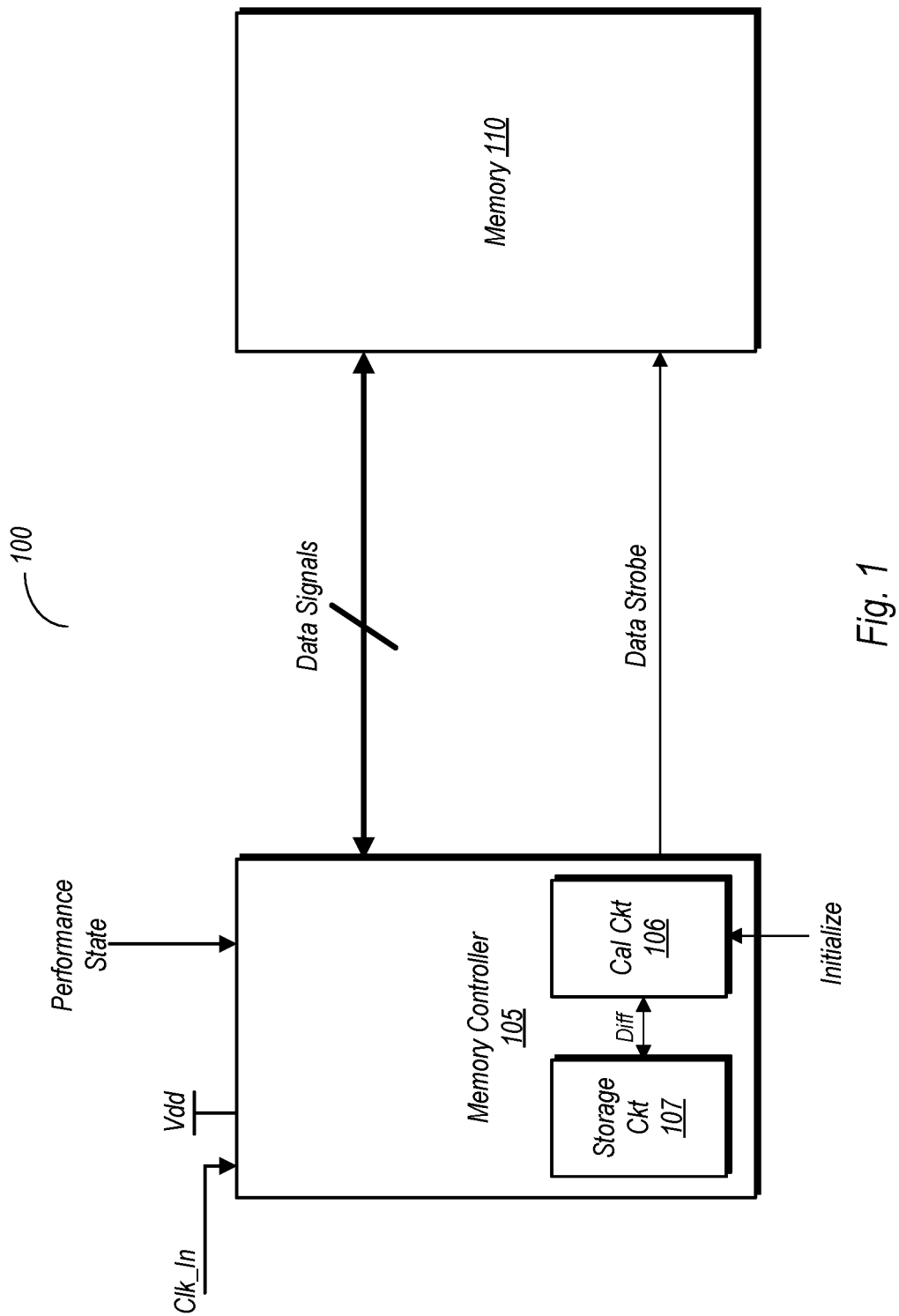
FIG. 1 is a block diagram of one embodiment of a memory subsystem.

The present disclosure is directed to various methods for calibrating parameters used in the operation of a memory subsystem and setting these parameters for normal operation. The memory calibrations include horizontal calibrations, in which a number of different delays are applied to a data strobe signal used to synchronize data transfers between a memory controller and a memory. In performing these calibrations, an optimal delay value may be determined.

The performance of memory calibrations can consume a significant amount of time. During the time at which calibrations are performed in a memory subsystem, the memory is unavailable for normal read and write traffic, thus impacting other agents which need to read data from or write data to the memory.

Performance of memory calibration is not only performed on a periodic basis, but may also be performed in response to a frequency change (e.g., change of the frequency of a clock signal). The time consumed by a calibration is increased in multi-rank memory systems (systems with multiple DRAMs sharing common pins). For real-time traffic, the time consumed calibrating memory during a frequency change may negatively impact overall system performance.

Many computing systems operate in different ones of a number of performance states. A performance state is defined herein as a unique combination of an operating voltage and clock frequency. Certain performance states may be used when performance is prioritized (e.g., when there is a higher workload), while other performance states may be used when power savings are prioritized (e.g., when workloads are light). During certain initialization operations (e.g., such as a cold boot-up), calibrations may be conducted in each of a number of the different performance states. The present disclosure makes use of the insight that the calibration results are recorded, as can be the differences between calibration results obtained in two different performance states.

Accordingly, the present disclosure includes a memory controller having circuitry for carrying out, during an initialization process, calibrations in each of the various possible system performance states and determining differences in results between each possible pair of these states. The insight also recognizes that the operating conditions encountered during the initialization process may be different than those encountered during normal operation (e.g., non-calibration, post-initialization operations where the system performs its intended functions). The differences are calculated between the various possible pairs of performance states and stored in a storage circuit. Thereafter, when a change is made from a first performance state to a second performance state, the calculated differences in calibrated operating parameters are used to set the operating parameters for the second performance state. For example, if a calculated difference in calibrated data strobe delay between the first and second performance state is a certain number of picoseconds, upon entry into the second performance state, the delay of the second state may be set by adjusting the delay of the first state by the calculated difference. After adjusting the parameters by the calculated differences between the two performance states, operation may begin without performing a horizontal calibration. Thus, the beginning of operation in the second performance state is not delayed by the amount of time required to perform the full horizontal calibration, thereby reducing the amount of time the memory subsystem is unavailable.

The present disclosure also makes use of the insight that time can be saved by performing margin checks of a particular calibrated parameter (e.g., a delay value as applied to a data strobe). Accordingly, the present disclosure contemplates a margin check calibration. In the margin check calibration, a limited number of points (e.g., two) may be checked to determine if they yield passing results (e.g., where passing results comprise data read from memory being equal to expected data). In one embodiment, this may be carried out by performing a calibration at a first delay point having less delay than the current operating delay point, and a second delay point having a greater amount of delay than the current operating delay point. If passing results are obtained at both of these points, a full horizontal calibration is skipped. This can considerably reduce the amount of time a memory is unavailable for normal operation. If, on the other hand, at least one of the delay points returns failing results, a full horizontal calibration may be performed.

Using the various methods described herein, memory unavailability may be significantly reduced. Furthermore, by foregoing various instances of a full horizontal calibration, power savings may be obtained as well as the system having a better power-to-performance ratio.

Various details of a memory subsystem and methods for operating the same in accordance with the present disclosure are now discussed. The discussion begins with various apparatus embodiments, including a memory subsystem, a more detailed discussion of a memory controller, and a larger system. A graphic illustration of one embodiment of a margin check calibration is then described, followed by a discussion of various method embodiments. The description concludes with discussion of various embodiments of an example system that may include a memory subsystem according to this disclosure.

Memory Subsystem Embodiments

FIG. 1 is a block diagram of one embodiment of a memory subsystem. In the embodiment shown, memory subsystem 100 includes a memory controller 105 and a memory 110. In one embodiment, memory 110 is a dynamic random access memory (DRAM) although other types of memories are possible and contemplated. Memory controller 105 and memory 110 are coupled to conveyed data signals between one another to carry out read and write operations. Additionally, memory controller 105 is configured to convey a data strobe signal to memory 110. The data strobe signal is a clock signal that is used to synchronize transfers of data between memory controller 105 and memory 110 during the performance of read and write operations. It is noted that in some embodiments, separate data strobe signals may be used to carry out read and write operations, with the memory controller 105 and memory 110 being configured accordingly.

Memory controller 105 in the embodiment shown includes a calibration circuit 106 and a storage circuit 107. The calibration circuit 106 may be used to carry out calibration operations to ensure that data may be written to and received from memory 110 at correct values. The calibrations may include horizontal calibrations in which delay values are applied to the data strobe signal while evaluating data received from memory 110 to ensure it is correct. The delay values may be applied over a particular range, and a calibrated value may be selected at least in part based on one that provides sufficient timing margin.

Vertical calibrations may also be carried out, with a vertical calibration comprising a number of horizontal calibrations performed at different values of a reference voltage that is used to distinguish between a logic 1 and a logic 0 for signals received from the memory. The vertical calibrations may be used to select a reference voltage that provides sufficient voltage margin for reading data returned from memory. The result of horizontal and vertical calibrations may thus result in an eye pattern that defines a range of delays and a range of voltages for which data may be correctly read from memory. In performing the horizontal and vertical calibrations, memory controller 105 may conduct a series of writes to memory along with a series of reads of data therefrom. Comparing the read data to the expected (e.g., written) data may determine whether a particular calibration point is passing or failing.

Memory subsystem 100 may operate in a number of different performance states. A performance state is defined herein as a unique combination of operating voltage and clock frequency. The operating voltage is represented herein by the supply voltage Vdd, while the clock frequency is represented by the input for the clock signal, Clk_In. Different performance states may be used depending on the desired performance of the system. For a high workload, e.g., when a number of different agents are requesting access to memory 110, a higher performance state (e.g., higher clock frequency and/or operating voltage) may be used. For lower performance demands (e.g., when memory access requests are relatively infrequent), memory subsystem 100 may operate in a lower performance state (e.g., lower clock frequency and/or lower supply voltage). The various calibrations discussed above may be performed for each of the different performance states available to memory subsystem. In one embodiment, each of the performance states may undergo calibrations as discussed above during an initialization process (e.g., when the Initialization signal is asserted). The initialization process may comprise various system boot procedures, including a cold boot and a warm boot. Exiting from a sleep state is another initialization process under which calibrations may be performed for all performance states.

In the embodiment shown, calibration results may be stored in storage circuit 107. The calibration results indicate the ranges of delay and reference voltage for which passing results were obtained as well as the particular delay point and reference voltage point selected for operation. During the initialization process described above, calibration circuit 106 may store in storage circuit 107 the results of the various calibrations carried out in the different performance states. Furthermore, in the illustrated embodiment, calibration circuit 106 may calculate differences in the various parameters for pairs of performance states, storing these differences in storage circuit 107. These differences may be utilized in subsequent operation during changes from one performance state to another. For example, during a change from a first performance state to a second performance state, the parameters used upon entry into the latter are determined by applying, to the parameters of the first performance state, the differences between the first and second performance states. Setting the parameters in the second performance state in this manner, instead of directly using the calibrated parameters for the second performance state, may account for operating conditions (e.g., temperature) that may have changed from the time that the previous calibrations were performed.

After applying the differences to set the operating parameters for the second performance state, as described above, normal operation may commence without performing a horizontal calibration. Thus, by setting parameters based on the applied differences in lieu of a full horizontal calibration, the amount of time that the memory subsystem is unavailable during the switch from the first performance state to the second performance state is reduced.

At some point subsequent to conducting normal operations in the second performance state, a margin check calibration may be performed to verify that the current operating parameters are still valid. The margin check calibration is a limited calibration in which only a few delay points are checked to determine results. In one embodiment, the margin check calibration is conducted at a first point having less delay than the current delay point, and a second delay point having a delay greater than the current delay point. If passing results are obtained at both the first and second delay points, no horizontal calibration is performed, and operation in the second performance state resumes using the current parameters. If, on the other hand, at least one of the delay points returns failing results, a full horizontal calibration is performed (and may also, or alternatively, include invoking a fatal interrupt). In performing the full horizontal calibration, the results for the second performance state stored in storage circuit 107 may be updated. Additionally, the differences between the calibration results of the first and second performance states may also be updated based on the results of the full horizontal calibration carried out in the second performance state. It is noted that in some instances, instead of directly applying the differences, heuristics can be used to determine the updated differences. For example, heuristics could be applied based on differences in operating conditions (e.g., temperature) between the present time and the previous time that differences were calculated in order to compensate for the changed operating conditions.

In some embodiments, the number of times a margin check calibration may be carried out is limited to a threshold value. Thus, when determining whether to perform a margin check calibration, a determination is made with regard to the number of times this type of calibration has been performed since entering the second performance state. If the number of times does not exceed the threshold, the margin check calibration may be performed. Furthermore, assuming passing results are returned each time, the margin check calibration may be performed periodically as long as the threshold has not been exceeded. If, however, the number of horizontal calibrations exceeds the threshold, a full horizontal calibration is carried out. The full horizontal calibration may include updating the calibrated parameters for the second performance state as well as the differences in pairs of performance states that include the second performance state.

Figure 2:
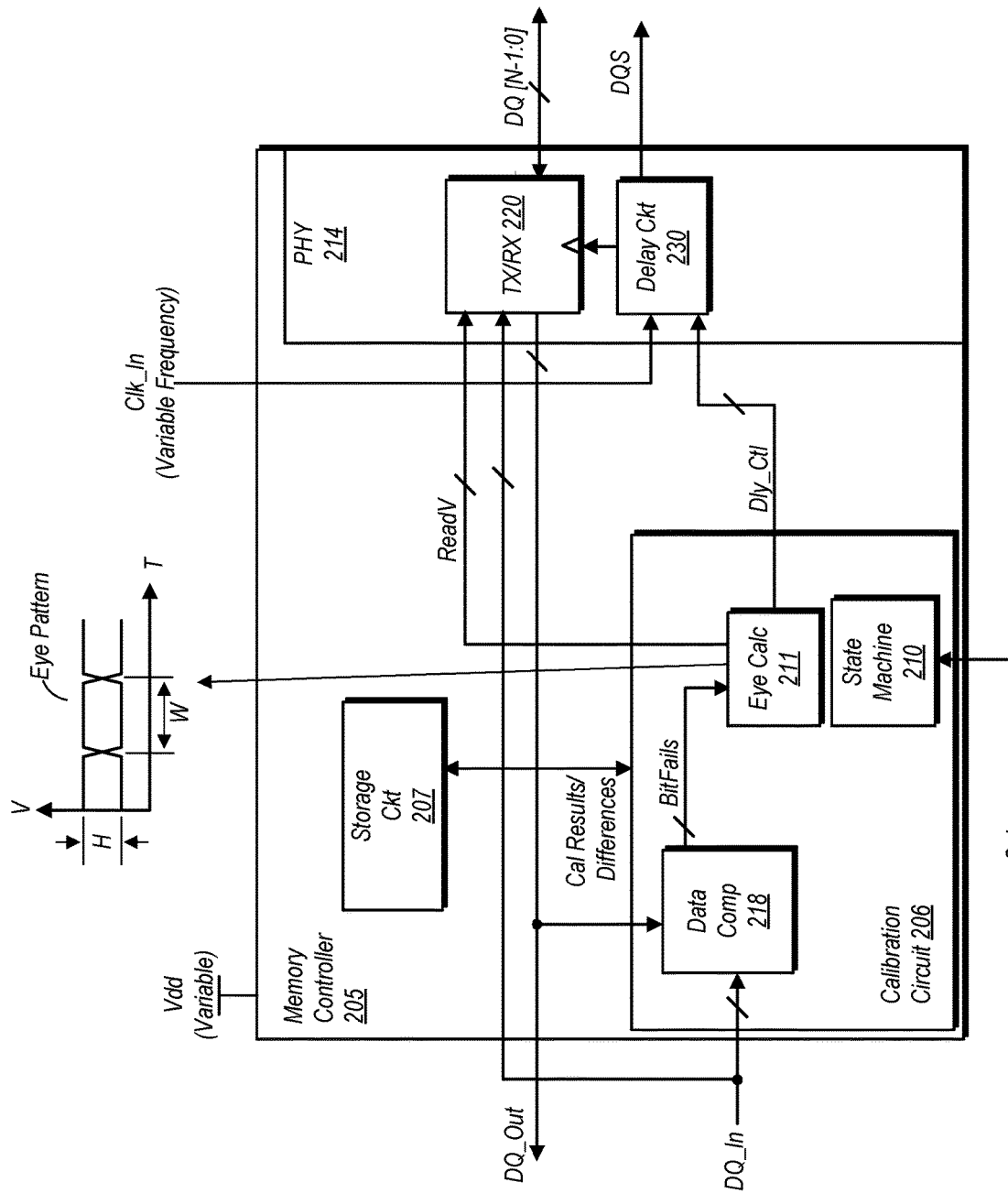
FIG. 2 is a block diagram of one embodiment of a memory controller.

FIG. 2 is a block diagram of one embodiment of a memory controller. In the embodiment shown, memory controller 205 includes a calibration control circuit 206 and a physical interface 214. Calibration control circuit 206 in the embodiment shown implements various circuit units, including data comparator 218, eye calculator 211, and a state machine 210. Physical interface 214 implements circuitry for communicating with a memory (not shown here). The circuitry of physical interface 214 includes transceiver 220 and a delay circuit 230. Data to be written to memory may be received by memory controller via the DQ_In signal path. Data read from memory may be conveyed to a requestor via the DQ_Out data bus.

In the embodiment shown, transceiver 220 of physical interface 214 is coupled to a data bus which includes data signal paths DQ[N-1:0]. Additionally, physical interface 214 includes a delay circuit 230 from which a data strobe signal, DQS, is generated (based on the variable frequency clock signal, Clk_In) and conveyed to the memory in order to synchronize transfers of data. Physical interface 214 may also include circuitry (not shown here) for adjusting various I/O settings associated with the transmission of signals to and reception of signals from memory. This may include circuitry for adjusting the drive strength of signals, controlling the impedances and/or termination of signal lines, and so on.

It is noted that in various embodiments, additional signal paths may be coupled to physical interface 214. These signal paths may include paths to convey write enable signals, read enable signals, address signals, and so on, from memory controller 205 to a correspondingly coupled memory. Similarly, physical interface 214 may include circuitry for generating these signals, and may include additional circuits for receiving signals. These additional signal paths and circuits are omitted here for the sake of simplicity, although their absence in the drawing is not intended to limit the disclosure in any way.

During read operations, transceiver 220 may receive signals conveyed from the memory via the signal paths DQ[N-1:0]. Transceiver 220 may also interpret the received signals using a reference voltage value (e.g., generated by a reference voltage generator circuit, not shown here). The reference voltage may be set by eye calculator 211, via the ReadV signal path. Using the reference voltage, transceiver 220 may determine whether individual ones of the received data signals are to be interpreted as a logic 0 or a logic 1. During normal operations, the output of transceiver 220, when operating to receive data from memory, is the DQ_Out signal path, with the data being conveyed to other units (e.g., to a requesting agent such as a processor core).

Delay circuit 230 in the embodiment shown is coupled to receive an input clock signal, Clk_In, provided from a source external to memory controller 205. Although not explicitly shown, delay circuit 230 may include one or more delay locked loops (DLLs) or other type of delay circuitry. Delay may be applied to the input clock signal to generate a data strobe signal, DQS, which is used to synchronize the transfer of other signals (e.g., DQ[N-1:0]) between a memory and memory controller 102. The amount of delay applied may be based on a delay control signal, Dly_Ctl, provided by eye calculator 211 in calibration control circuit 206. In addition to conveying the data strobe signal to the memory, delay circuit 230 in the embodiment shown is also coupled to provide a clock signal to transceiver 220.

Calibration operations may include varying the reference voltage and an amount of delay applied to the data strobe signal. Horizontal calibrations may include varying the delay over a number of different values at a particular reference voltage. A vertical calibration may include performing a number of horizontal calibrations at different reference voltage values. At each combination of a delay and a reference voltage, data may be read from memory and compared to expected values by data comparator 218 in order to determine if any bit fails occur. A bit fail may be defined herein as a bit corresponding to a signal conveyed on a particular signal path of the data bus not matching its expected value (e.g., the bit is read as a logic 0 when a logic 1 is expected). In some embodiments, the data that is compared may be received by data comparator 218 via the DQ_In input, and thus the corresponding calibration operations may include the writing of this data to memory.

Bit fails may be reported to eye calculator circuit 211. Responsive to receiving information of a bit fail, eye calculation circuit 211 may record the failing bit along with the reference voltage value and the delay value. Based on the data from failing bits and corresponding reference voltage and delay values, eye calculation circuit 211 may calculate an eye pattern. In some embodiments, an eye pattern may be calculated for each bit position individually, with the eye being calculated based on, e.g., an average of the individual signal paths.

Some calibration operations may include a number of writes of data to memory in addition to a number of reads of data from memory. Over a number of iterations, eye calculator 211 may cause adjustments to both the delay used in generation of the data strobe signal (via the Dly_Ctl signal) and the voltage used to distinguish between a logic 1 and a logic 0. Performing these operations for a number of different delay and reference voltage values may be used to define the eye pattern for the calibrated signal paths. An example eye pattern is shown in FIG. 2, with its height H defined along the vertical, voltage axis V, while the width W is defined along the time axis T. The voltage axis represents values of the reference voltage, while the time axis represents delay values applied to the data strobe signal by delay circuit 230. Values within the boundaries indicated in the drawing, defined in part by the height and width of the eye pattern, indicate areas where data bits conveyed in a signal can be correctly interpreted as a logic 1 or a logic 0. The areas toward the center of the eye pattern generally have a larger amount of timing margin and voltage margin than those located toward the boundaries.

State machine 210 in the embodiment shown is configured to coordinate the calibration operations. Responsive to receiving a calibration signal (Cal) from either within another portion of memory controller 205 or from an external source, state machine 210 may commence calibration operations. Assertion of the calibration signal may be performed in conjunction with a system startup, upon an exit from a sleep state, at periodic intervals, and in response to changes in a performance state, among other conditions. During calibration operations, state machine 210 may communicate with eye calculator 211, data comparator 218, and transceiver 220. Among the functions that state machine 210 may perform is issuing commands to transmit data for write operations, to cause memory controller 102 to read data from memory, and to cause a change to the delay and read voltage values. Upon completing a given calibration, eye calculator 211 may store the determined reference voltage and delay values. These values may then be used to set the reference voltage and delay values for normal (e.g., non-calibration) operations.

State machine 210 may also cause the calculating of differences between pairs of performance states by, e.g., eye calculator 211. These differences, as well as the calibration results on which they are based, may be stored in storage circuit 207. During a change from one performance state to another, calibration circuit 206 may access these differences and cause eye calculator 211 to set the operating parameters (delay and reference voltage) for operating in the newly-entered performance state. Subsequently, in some embodiments, state machine 210 may cause a margin check calibration to be carried out, and, if passing results are obtained therefrom, cause a horizontal calibration to be skipped. In some embodiments, state machine 210 may also determine whether a number of margin check calibrations has exceeded a threshold value. If it is determined that the number of margin check calibrations exceeds the threshold, state machine 210 may cause a full horizontal calibration to be performed. Otherwise, if the number is less than the threshold, state machine 210 may instead cause another instance of the margin check calibration to be performed in lieu of performing the full horizontal calibration. However, if the margin check calibration returns failing results, state machine 210 may cause a full horizontal calibration to be performed in response thereto.

Figure 3:
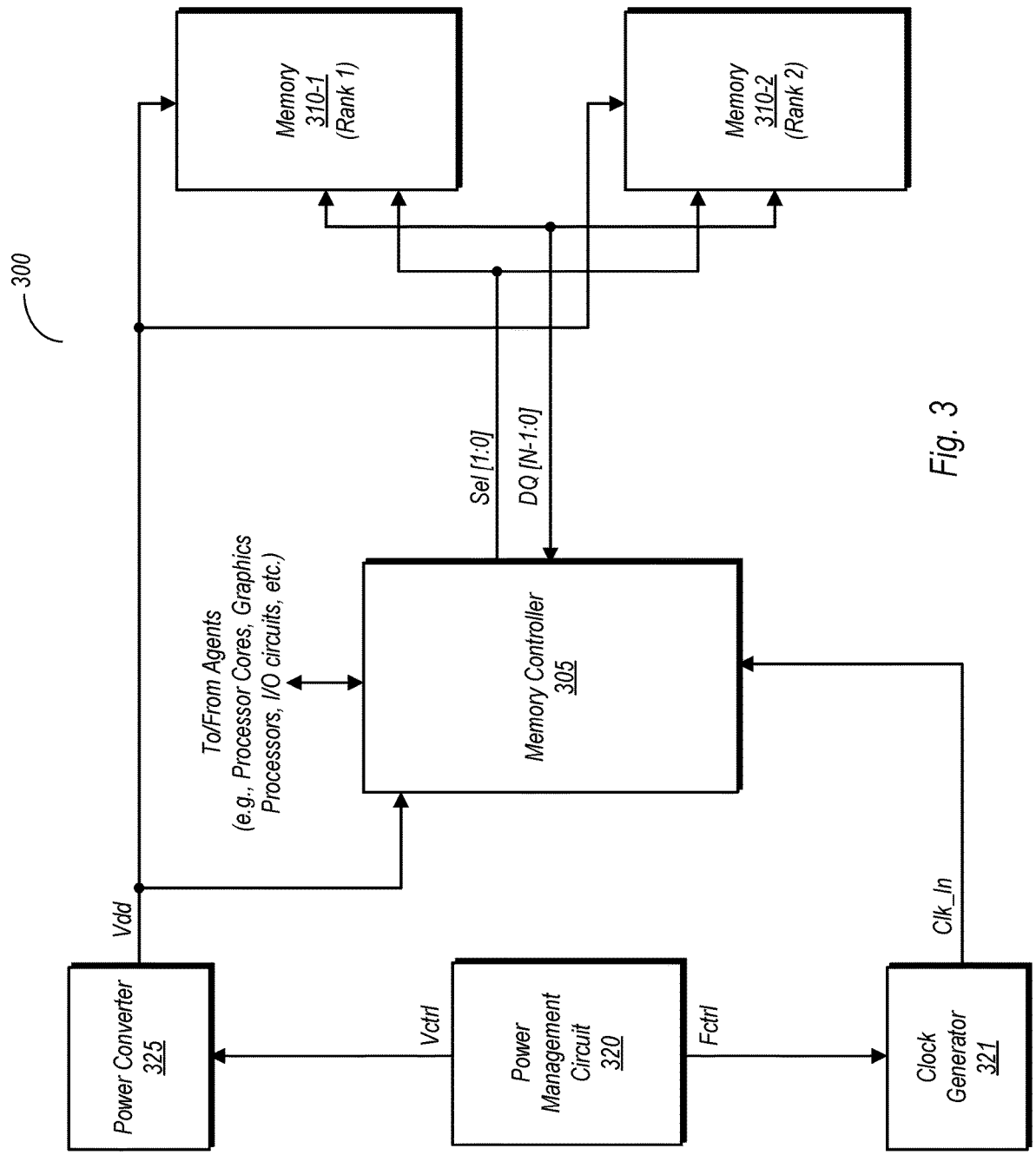
FIG. 3 is a block diagram of one embodiment of a system.

FIG. 3 is a block diagram of one embodiment of a system that includes a memory controller and a dual-rank memory. In the embodiment shown, memory controller 305 may be a memory controller in accordance with the embodiments discussed above. More generally, memory controller 305 in the embodiment shown is capable of carrying out the various operations of the memory controllers discussed in FIGS. 1 and 2, irrespective of its internal arrangement. Memory controller 305 is coupled to various agents (not shown here) such as one or more processor cores, one or more graphics processors, and one or more input/output circuits. In general, memory controller 305 may be coupled to any agent that utilizes system memory. The actual coupling of memory controller 305 to these agents may be through an on-chip network/fabric that includes circuits such as crossbar switches, and so on.

The dual-rank memory in the embodiment shown includes memory 310-1 (Rank 1) and Memory 310-2 (Rank 2). Both of these memories are coupled to memory controller 305 by the memory bus configured to convey data signals DQ[N-1:0]. A select signal is also provided from memory controller 305 to memories 310-a and 310-2 to select one of the memories for read and/or write operations.

System 300 also includes a power management circuit 320, a power converter 325, and a clock generator 321. Power converter 325 in the embodiment shown is configured to generate an adjustable supply voltage Vdd that is provided to memory controller 305 as well as memories 310-1 and 310-2. Any suitable type of power converter may be used, including various types of buck converters, boost converters, low dropout voltage regulators, and so on. Clock generator 321 is configured to generate a clock signal provided to memory controller 305, with the clock signal having an adjustable frequency. The circuitry of clock generator 321 may include phase-locked loops, ring oscillators, and/or any other suitable circuitry for generating a clock signal at a number of different frequencies. Power management circuit 320 in the embodiment shown may control the performance state of system 300. The Vctrl signal shown here may represent one or more signals or commands used to cause power converter 325 to the operating voltage of the desired performance state. Similarly, power management circuit 320 may send commands under the label Fctrl to clock generator 321 to set the frequency of the clock signal, Clk_In, to the value corresponding to the desired performance state. Although not explicitly shown here, power management circuit 320 may be coupled to a number of other circuits within system 300 (including ones not shown here), and may, through various telemetry, monitor operating conditions to select an optimal performance state.

Figure 4:
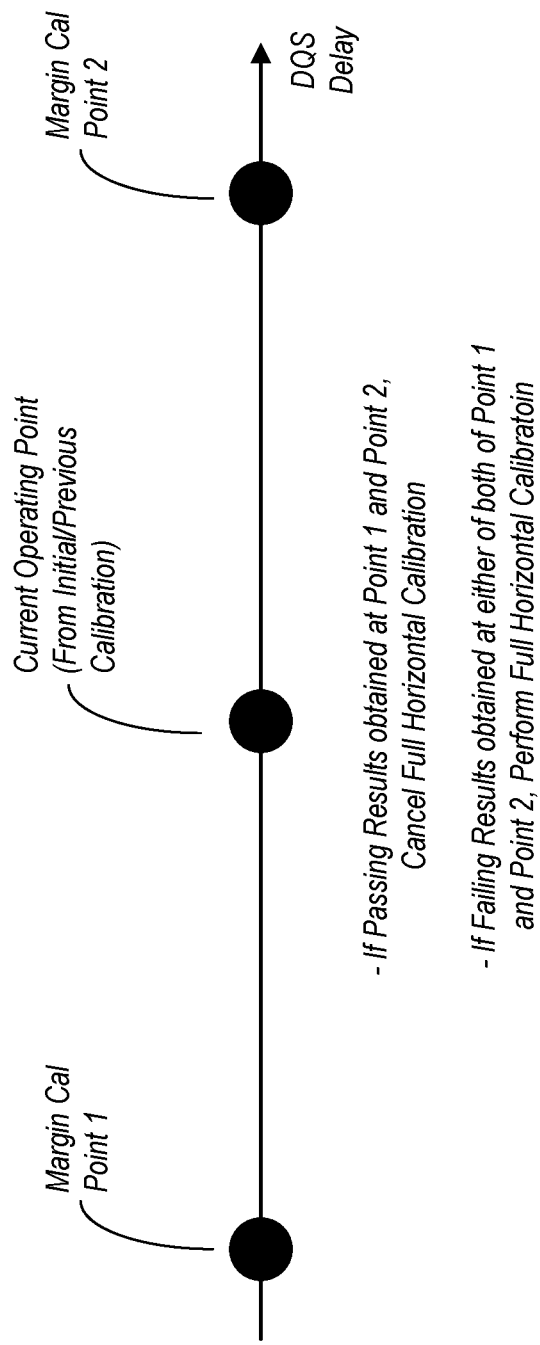
FIG. 4 is a graphic illustration of one embodiment of a margin check calibration.

Graphic Illustration of Margin Check Calibration:

FIG. 4 is a graphic illustration of one embodiment of a margin check calibration per the disclosure. The margin check calibration may be used to verify that a current delay value as applied to the data strobe signal, determined from a previous calibration, is still valid. This may be performed by conducting a calibration at two points, Margin Cal Point 1 and Margin Cal Point 2. Margin Cal Point 1 represents a delay that is less than the current operating point determined from a previous/initial calibration. Margin Cal Point 2 represents a delay that is greater than the current operating point. At both of these points, a number of writes of data to memory and reads of data from memory may be conducted. The data that is read from memory is then compared with expected data (e.g., data that was written) to determine if they match. If the data that is read matches the expected data at both of the margin calibration points, the margin check calibration is considered to have passed, and operation continues using the same operating point. If the data read from memory does not match the expected data at one or both points, the margin check calibration is considered to have failed, and a full horizontal calibration is then performed.

A successful margin check calibration that yields passing results may be conducted in significantly less time than a full horizontal calibration. Accordingly, passing instances of the margin check calibration may provide a substantial reduction of time the memory subsystem is unavailable.

Figure 5:
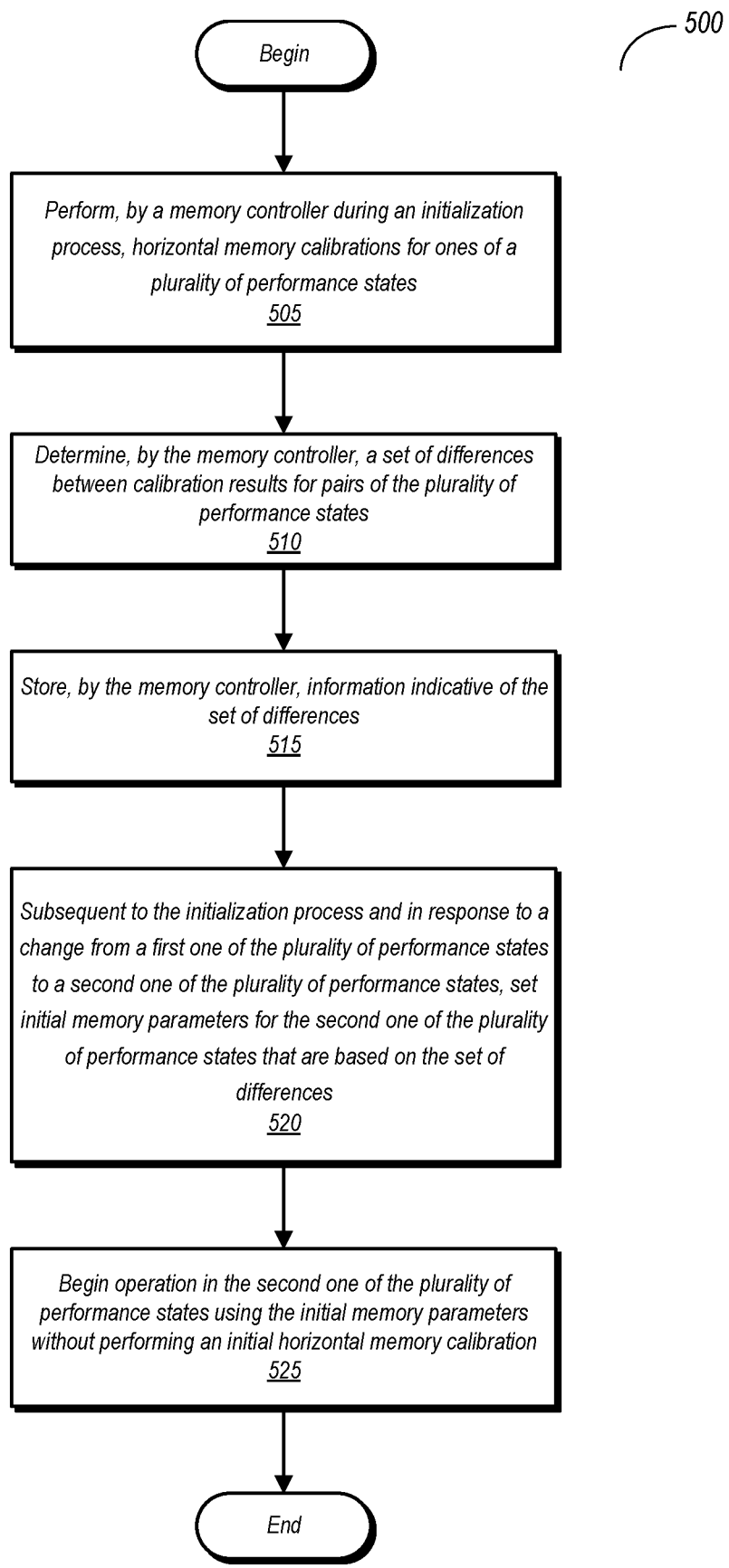
FIG. 5 is a flow diagram of one embodiment a flow diagram for operating a memory subsystem.

Method Flow Diagrams:

FIG. 5 is a flow diagram of one embodiment of a method for operating a memory controller. Method 500 may be carried out by any of the apparatus embodiments discussed above. Furthermore, embodiments of an apparatus capable of carrying out Method 500, but not explicitly disclosed herein, are also considered to fall within the scope of this disclosure.

Method 500 includes performing, by a memory controller during an initialization process, horizontal memory calibrations for ones of a plurality of performance states (block 505). The method further includes determining, by the memory controller, a set of differences between calibration results for pairs of the plurality of performance states (block 510) and storing, by the memory controller, information indicative of the set of differences (block 515). Subsequent to the initialization process and in response to a change from a first one of the plurality of performance states to a second one of the plurality of performance states, the method includes setting initial memory parameters for the second one of the plurality of performance states that are based on the set of differences (block 520) and beginning operation in the second one of the plurality of performance states using the initial memory parameters without performing an initial horizontal memory calibration (block 525).

In various embodiments, the method includes performing, using the calibration circuit, a margin check calibration. Performing the margin check calibration includes determining if a calibration result at a first point provides passing results, wherein the first point corresponds to a delay value that is less than a calibrated delay point and determining if a calibration result at a second point provides passing results, wherein the second point corresponds to a delay value that is greater than the calibrated delay point. In response to determining that calibration results at the first point and the second point are passing results, the method includes skipping performing a full horizontal calibration in the second performance state. Otherwise, the method includes performing a full horizontal calibration if at least one of the calibration results from one of the first and second points does not produce a passing result. Alternative embodiments are also possible and contemplated in which an interrupt may be invoked in response to failing the margin calibration. In such embodiments, an interrupt handler may be used to, e.g., disable the use of future margin check calibrations during operation in the particular performance state in the event of too many failures.

A given performance state of one of the plurality of performance states includes a unique combination of an operating voltage and a clock frequency relative to other ones of the plurality of performance states. An initialization process may be a startup routine (e.g., a system boot-up procedure). The disclosure contemplates that an initialization routine may also be a wake-up from a sleep state or a system reset that does not otherwise include a full system reboot.

Figure 6:
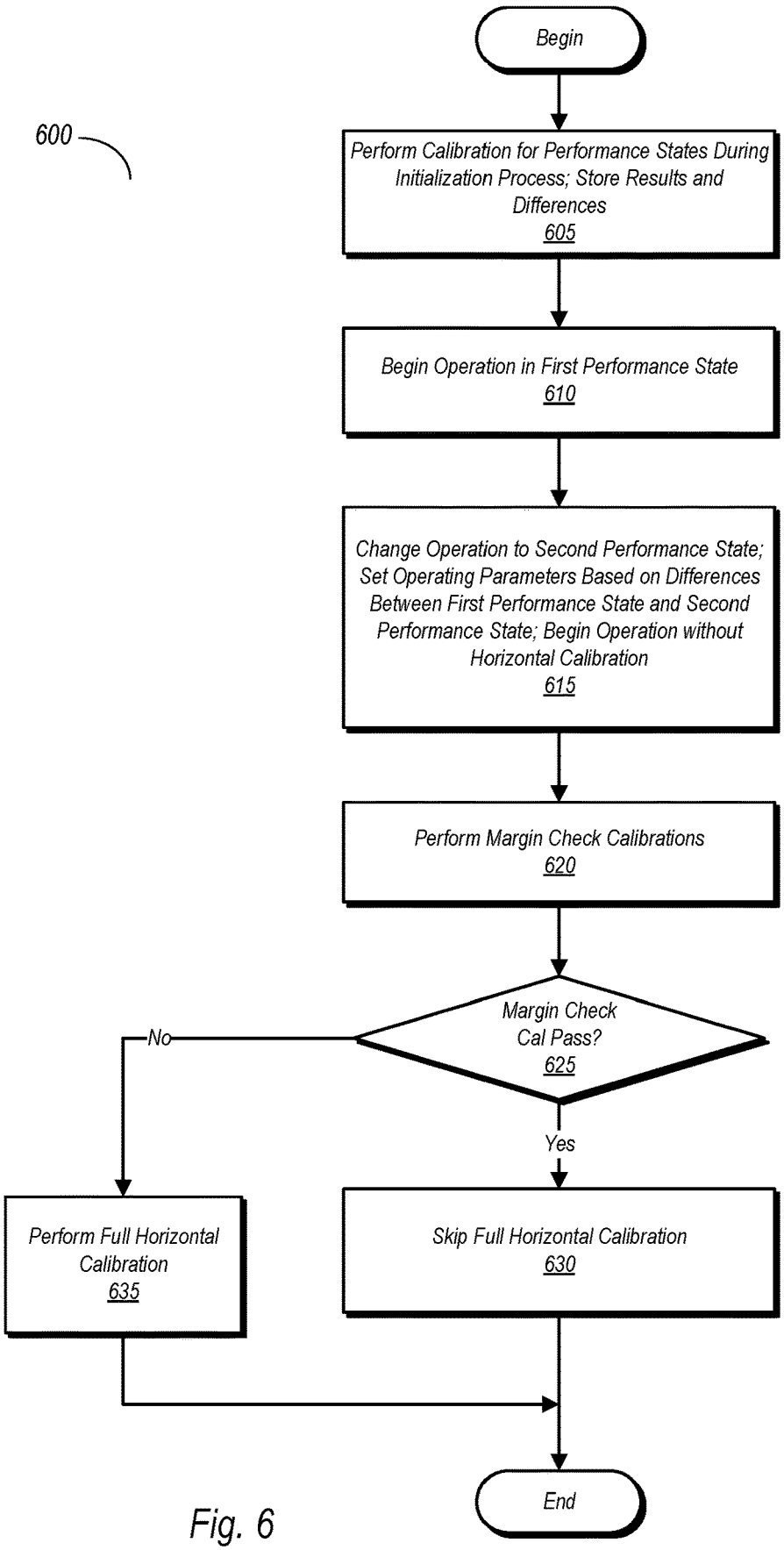
FIG. 6 is a flow diagram of one embodiment of a flow diagram for operating a memory subsystem.

FIG. 6 is a flow diagram of another embodiment of a method for operating a memory subsystem. Method 600 may be carried out by various ones of the apparatus embodiments discussed above. Apparatus embodiments capable of carrying out Method 600 but not otherwise disclosed herein are also considered to fall within the scope of this disclosure.

Method 600 begins with the performing of calibrations in ones of a number of different performance states during an initialization routine and storing the results, along with differences between calibrations in the various performance states, in a storage circuit (block 605). The calibrations performed include horizontal calibrations in which various amounts of delay are applied to a data strobe signal to determine a delay value to be applied for sampling during subsequent operation. The present disclosure further contemplates performing vertical calibrations that comprise performing horizontal calibrations at a number of different reference voltage values, wherein the reference voltage is a sampling voltage used to determine whether a received signal is a logic 0 or a logic 1. By performing these calibrations, an eye pattern may be determined such that signals may be sampled with an optimal amount of timing and voltage margin.

After completing the calibrations during the initialization routine, normal operation then commences in a first performance state. Normal operation is defined herein as the memory subsystem carrying out its intended operations to support intended system functions. For the memory subsystem, this includes reading data to be provided to other agents (e.g., reading operands to be used in operations carried out by a processor core), writing and storing data received from other agents (e.g., writing/storing results from operations carried out by a processor core) and so on. The initialization routine may be a system start-up (e.g., cold boot), a reset (e.g., warm boot), waking from a sleep state, and so on. The first performance state may be any one of the number of performance states for which calibrations were performed during the initialization routine.

Method 600 further includes changing from operation in the first performance state to a second performance state and setting operating parameters based on the differences between these states, while skipping the performance of a horizontal calibration in the second performance state (block 615). For example, if there is a particular difference in delay values at which signals are sampled in the first performance state and that at which signals are sampled in the second performance state, the parameters are adjusted by that amount upon entry into the second performance state. Other parameters (e.g., a reference voltage) may be similarly adjusted as well. These adjustments may be carried out to allow operation in the second performance state to commence with minimal delay relative to that which would be incurred by performing a full horizontal calibration.

At some point subsequent to beginning normal operation in the second performance state, a margin check calibration is conducted (block 620). As discussed above, a margin check calibration is a limited calibration that may be conducted in lieu of a full horizontal calibration, and may be carried out by performing a calibration routine at two different delay points. The delay at a first point is less than that of the current operating point, while the delay at the second point is greater than that of the current operating point. If the margin check calibration obtains passing results at both of these points (block 625, yes), then the full horizontal calibration is skipped (block 630). Passing results are defined herein as data read from the memory is equal to the expected data. A passing of the margin check calibration may indicate that the current operating parameters remain valid under the present operating conditions in the second performance state. Additionally performing the margin check calibration in lieu of the full horizontal calibration can reduce the amount of time the memory subsystem is unavailable for normal memory transactions due to calibrations. If the margin check calibration fails to obtain passing results from at least one of the first or second points (block 625, no), then a full horizontal calibration is performed (block 635).

Figure 7:
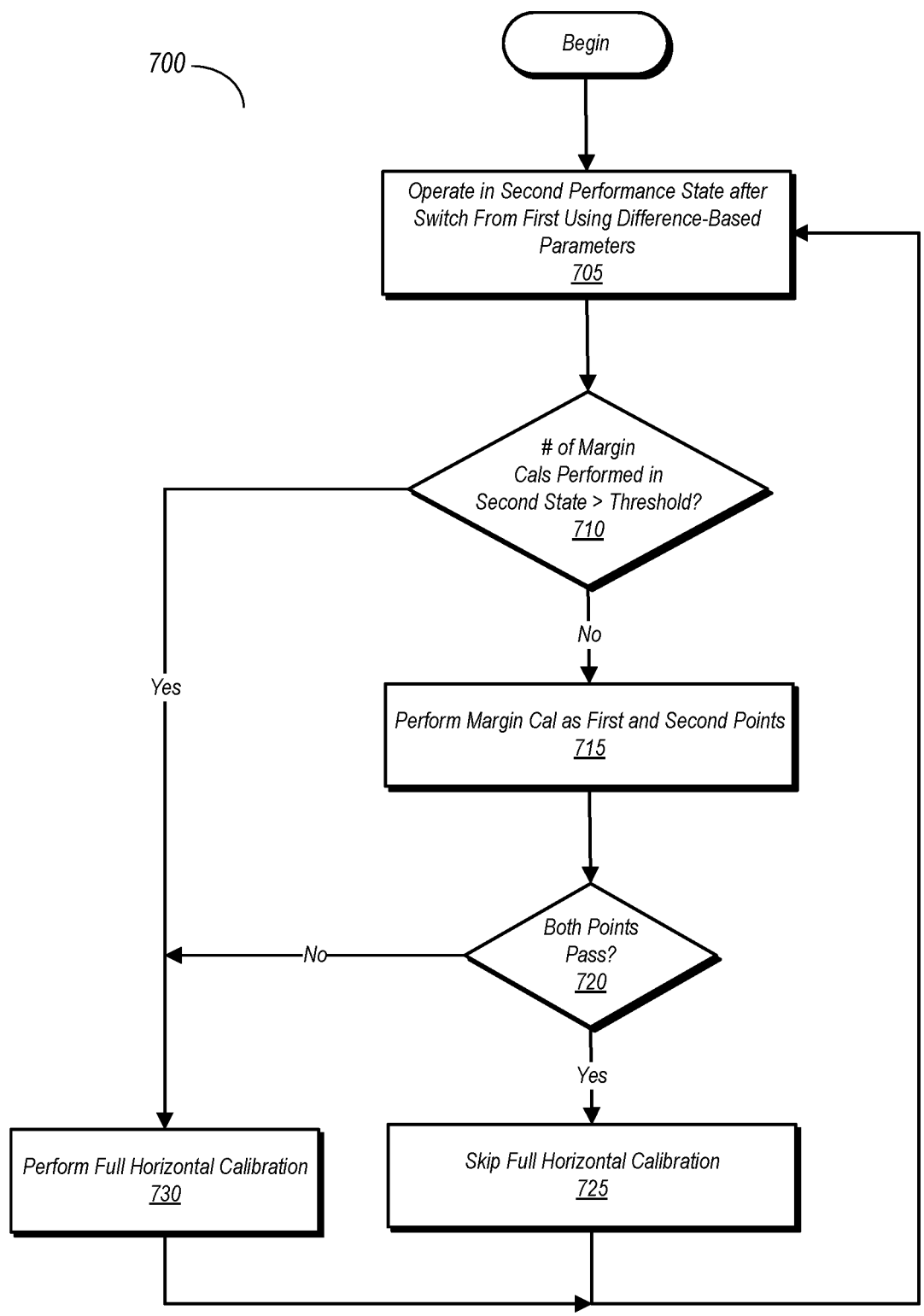
FIG. 7 is a flow diagram of one embodiment of a flow diagram for operating a memory subsystem.

FIG. 7 is a flow diagram of another embodiment of a method for operating a memory subsystem. Method 700 may be carried out by various ones of the apparatus embodiments discussed above. Apparatus embodiments capable of carrying out Method 700 but not otherwise disclosed herein are also considered to fall within the scope of this disclosure.

Method 700 begins with operating in a second performance state after having switched from operating in a first performance state, using difference-based parameters (block 705). The difference based parameters are those determined based on the calculated differences determined in the performance of horizontal memory calibrations in the various performance states during a system initialization process. After operating in the second performance state for some time, a check may be carried out to determine a number of margin check calibrations that have been performed since entry into the state (block 710). If the number of margin check calibrations is not greater than some threshold value (block 710, no), then a margin check calibration is performed (block 715). As discussed above, a margin check calibration comprises performing a calibration at two different delay points relative to the current operating delay point, and determining whether or not passing results are obtained. If the margin check calibration yields passing results at both points (block 720, yes), then a full horizontal calibration is skipped (block 725), and method 700 returns to block 705.

If it is determined that the number of margin check calibrations performed while operating in the second performance state has exceeded the threshold (block 710, yes), then a full horizontal calibration is performed (block 730). The full horizontal calibration may be performed at a number of different points over a wider range of delay values than the margin check calibration. In the event that the number of margin check calibrations does not exceed the threshold (block 710, no), but at least one of the points does not provide passing results (block 720, no) during a margin check calibration, a full horizontal calibration is performed.

In the embodiment of Method 700 illustrated here, it is assumed that once the threshold value has been exceeded for a number of margin check calibrations, subsequent periodic calibrations performed while remaining in the current performance state are full horizontal calibrations. However, embodiments are possible and contemplated in which full horizontal calibrations are performed only when a number of margin check calibrations subsequent to a horizontal calibration exceeds the threshold or when a particular margin check calibration provides failing results. Otherwise, margin check calibrations may be conducted at periodic intervals, as long as they continue to produce passing results, until the threshold is exceeded for the number of margin calibrations carried out since the most recent horizontal calibration. In this manner, a majority of the calibrations performed after entering a particular performance state may be margin check calibrations, thereby further reducing the amount of time the memory subsystem is unavailable for normal memory transactions.

It is further noted that calculated differences may be updated after the performance of a full horizontal calibration. For example, when a full horizontal calibration is performed in a second performance state after having previously operated in a first performance state, the results from the full horizontal calibration (in the second state) may be used to calculate updated differences relative to those of a most recent horizontal calibration carried out in the first performance state. In this manner, a current set of differences may more accurately reflect changing system operating conditions over time. As further noted above, embodiments are possible and contemplated in which, instead of directly applying the differences, heuristics may be applied to, e.g., account for changes in operating conditions such as temperature. The previously calculated differences may thus be modified by the heuristics to account for the current operation conditions relative to those that were present during their initial calculation.

Example System

Figure 8:
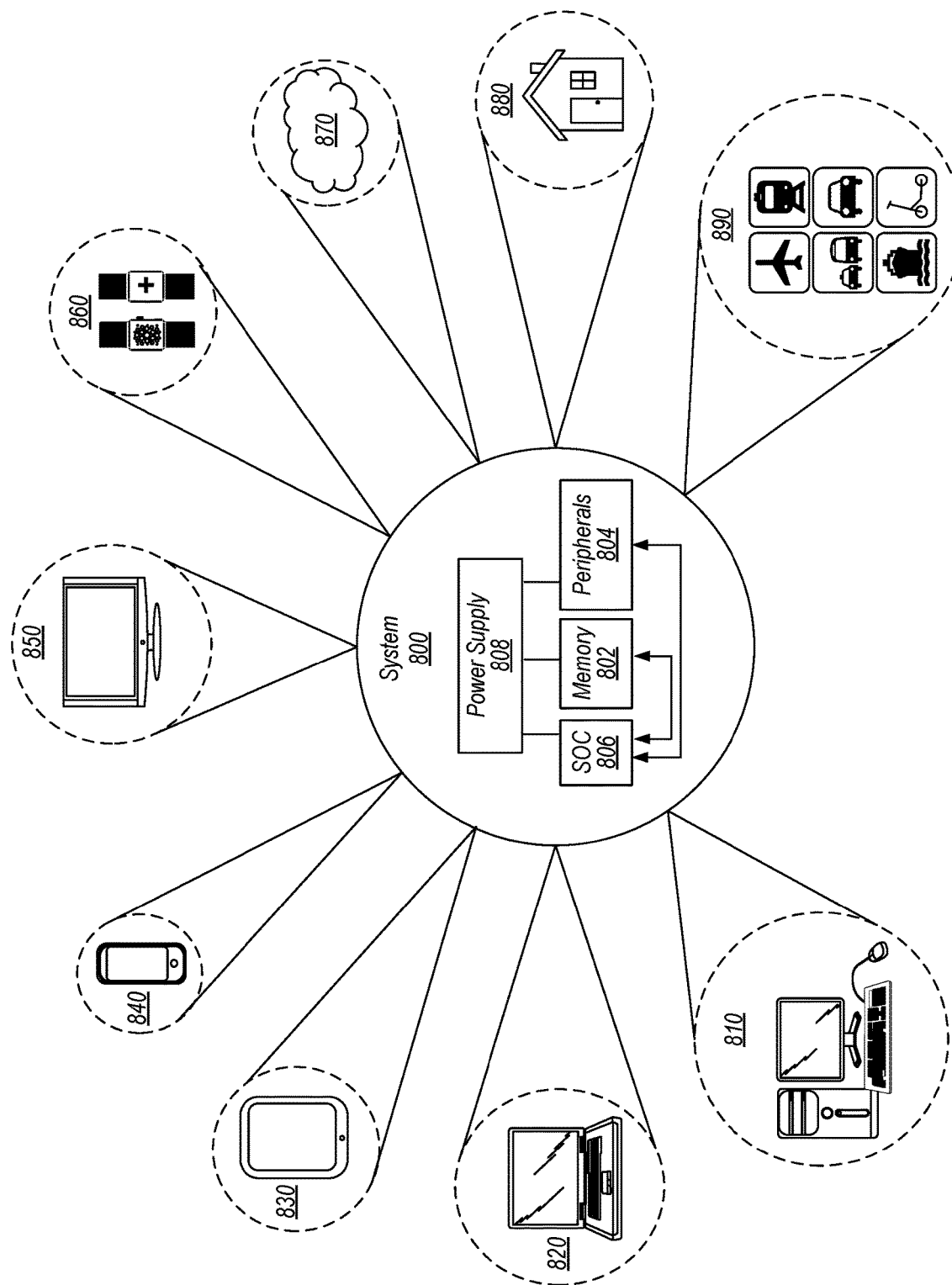
FIG. 8 is a block diagram of one embodiment of an example system.

Turning next to FIG. 8, a block diagram of one embodiment of a system 800 is shown that may incorporate and/or otherwise utilize the methods and mechanisms described herein. In the illustrated embodiment, the system 800 includes at least one instance of a system on chip (SoC) 806 which may include multiple types of processing units, such as a central processing unit (CPU), a graphics processing unit (GPU), or otherwise, a communication fabric, and interfaces to memories and input/output devices. In some embodiments, one or more processors in SoC 806 includes multiple execution lanes and an instruction issue queue. In various embodiments, SoC 806 is coupled to external memory 802, peripherals 804, and power supply 808.

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

SoC 806 in the embodiment shown may include at least one memory controller coupled to memory 802, with the memory controller and the memory forming a memory subsystem. The memory controller may include a calibration circuit that carries out various memory calibrations in accordance with the discussion above. These calibrations may include the horizontal calibrations as well as the margin check calibrations disclosed herein.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, smartwatch 860 may include a variety of general-purpose computing related functions. For example, smartwatch 860 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(*f*) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
  a memory; and
  a memory controller coupled to the memory, wherein the memory controller includes a calibration circuit configured to:
    perform, during an initialization process, horizontal memory calibrations for ones of a plurality of performance states; and
    determine and store, in a storage circuit, information indicative of a set of differences between calibration results for pairs of the plurality of performance states;
  wherein the memory controller is further configured to, subsequent to the initialization process and in response to a change from a first one of the plurality of performance states to a second one of the plurality of performance states:
    set initial memory parameters for the second performance state based on the set of differences; and
    begin operation in the second performance state without performing an initial horizontal calibration.

2. The apparatus of claim 1, wherein a given performance state of one of the plurality of performance states includes a unique combination of an operating voltage and a clock frequency relative to other ones of the plurality of performance states.

3. The apparatus of claim 1, wherein the calibration circuit is further configured to, subsequent to operating in the second performance state, perform a margin check calibration, wherein to perform the margin check calibration, the calibration circuit is further configured to:
  determine if a calibration result at a first point provides passing results, wherein the first point corresponds to a delay value that is less than a calibrated delay point; and
  determine if a calibration result at a second point provides passing results, wherein the second point corresponds to a delay value that is greater than the calibrated delay point.

4. The apparatus of claim 3, wherein the calibration circuit is configured to skip performing a full horizontal calibration in the second performance state in response to determining that the calibration results at the first point and the second point are passing results.

5. The apparatus of claim 3, wherein the calibration circuit is further configured to:
  perform a full horizontal calibration in the second performance state in response to determining that at least one of the calibration results at the first and second points does not pass; and
  update the set of differences based on results of the full horizontal calibration.

6. The apparatus of claim 3, wherein the calibration circuit is further configured to limit, to a threshold value, a number of times that the margin check calibration is performed subsequent to entering the second performance state, and in response to determining that the number of times the margin check calibration has been performed exceeds the threshold, perform a full horizontal calibration instead of the margin check calibration.

7. The apparatus of claim 1, wherein in performing a horizontal calibration, the calibration circuit is configured to perform writes of data to and reads of data from memory at a particular reference voltage and at differing values of delay applied to a data strobe signal.

8. The apparatus of claim 1, wherein the memory comprises a multi-rank memory system having a first set of memory circuits and a second set of memory circuits sharing a common set of signal paths between the memory controller and the memory.

9. The apparatus of claim 1, wherein the calibration circuit is further configured to, subsequent to the initialization process, perform one or more periodic horizontal calibrations during operations in the first one of the plurality of performance states and prior to changing to the second one of the plurality of performance states, and further configured to set initial memory parameters for the second one of the plurality of performance states based on the a most recent horizontal calibration performed in the first one of the plurality of performance states prior transitioning to the second performance state.

10. The apparatus of claim 1, wherein the initialization process comprises a system startup.

11. A method, comprising:
  performing, by a memory controller during an initialization process, horizontal memory calibrations for ones of a plurality of performance states;
  determining, by the memory controller, a set of differences between calibration results for pairs of the plurality of performance states;
  storing, by the memory controller, information indicative of the set of differences;
  subsequent to the initialization process and in response to a change from a first one of the plurality of performance states to a second one of the plurality of performance states:
    setting initial memory parameters for the second one of the plurality of performance states that are based on the set of differences; and
    beginning operation in the second one of the plurality of performance states using the initial memory parameters without performing an initial horizontal memory calibration.

12. The method of claim 11, further comprising performing, using a calibration circuit, a margin check calibration, wherein performing the margin check calibration comprises:
  determining if a calibration result at a first point provides passing results, wherein the first point corresponds to a delay value that is less than a calibrated delay point; and
  determining if a calibration result at a second point provides passing results, wherein the second point corresponds to a delay value that is greater than the calibrated delay point.

13. The method of claim 12, further comprising skipping performing a full horizontal calibration in the second one of the plurality of performance states in response to determining that calibration results at the first point and the second point are passing results.

14. The method of claim 13, further comprising performing a full horizontal calibration if at least one of the calibration results from one of the first and second points does not produce a passing result.

15. The method of claim 11, wherein a given performance state of one of the plurality of performance states includes a unique combination of an operating voltage and a clock frequency relative to other ones of the plurality of performance states.

16. The method of claim 11, wherein the initialization process comprises a startup routine.

17. A system comprising:
a memory subsystem having a memory controller coupled to a memory, wherein the memory controller includes a calibration circuit configured to perform, during an initialization process, horizontal memory calibrations for ones of a plurality of performance states, and a storage circuit configured to store information indicative of a set of differences between calibration results for pairs of the plurality of performance states; and
a power management circuit configured to change operation of the memory subsystem from a first one of the plurality of performance states to a second one of the plurality of performance states;
wherein the memory controller is further configured to, subsequent to the initialization process and in response to a change from a first one of the plurality of performance states to a second one of the plurality of performance states, set initial parameters for the second performance state based on the set of differences and begin operation in the second performance state without performing an initial horizontal calibration.

18. The system of claim 17, wherein a given performance state of one of the plurality of performance states includes a unique combination of an operating voltage and a clock frequency relative to other ones of the plurality of performance states.

19. The system of claim 17, wherein the calibration circuit is configured to perform a margin check calibration comprising determining if calibration results at a first point and a second point provide passing results, at a wherein the first point corresponds to a delay value that is less than a calibrated delay point and wherein the second point corresponds to a delay value that is greater than the calibrated delay point; and wherein the calibration circuit is further configured to skip performing a full horizontal calibration in the second performance state in response to determining that the calibration results at the first point and the second point are passing results.

20. The system of claim 17, wherein the initialization process comprises a system startup routine.

* * * * *